(12) United States Patent
Weng

(10) Patent No.: US 11,361,723 B2
(45) Date of Patent: Jun. 14, 2022

(54) SHIFT REGISTER UNIT, GATE DRIVING CIRCUIT AND METHOD FOR DRIVING THE SAME, AND DISPLAY APPARATUS

(71) Applicants: FUZHOU BOE OPTOELECTRONICS TECHNOLOGY CO., LTD., Fuzhou (CN); BOE TECHNOLOGY GROUP CO., LTD., Beijing (CN)

(72) Inventor: Zuwei Weng, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 622 days.

(21) Appl. No.: 16/335,646

(22) PCT Filed: Sep. 29, 2018

(86) PCT No.: PCT/CN2018/108723
§ 371 (c)(1),
(2) Date: Mar. 21, 2019

(87) PCT Pub. No.: WO2019/134412
PCT Pub. Date: Jul. 11, 2019

(65) Prior Publication Data
US 2021/0358438 A1 Nov. 18, 2021

(30) Foreign Application Priority Data
Jan. 2, 2018 (CN) .......................... 201810001751.3

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/0286* (2013.01)

(58) Field of Classification Search
CPC ......... G09G 3/3677; G09G 2310/0286; G11C 19/28
See application file for complete search history.

(56) References Cited

U.S. PATENT DOCUMENTS 9,793,004 B2 12/2017 Zhang
10,902,811 B2 1/2021 Wang
(Continued)

FOREIGN PATENT DOCUMENTS

CN 101546607 A 9/2009
CN 202443728 U 9/2012
(Continued)

OTHER PUBLICATIONS

Extended European Search Report dated May 6, 2021, received for corresponding European Application No. 18855190.7, 13 pages.
(Continued)

*Primary Examiner* — Lixi C Simpson
(74) *Attorney, Agent, or Firm* — Kinney & Lange, P.A.

(57) ABSTRACT

The present disclosure provides a shift register unit, a gate driving circuit and a method for driving the same, and a display apparatus. The shift register unit includes: an input sub-circuit coupled to an input signal terminal and a pull-up node and configured to transmit an input signal from the input signal terminal to the pull-up node under control of the input signal; and n output sub-circuits, wherein each of the n output sub-circuits is coupled to the pull-up node, one of n clock signal terminals, a first level signal terminal, and one of n output signal terminals, and is configured to transmit a clock signal from the clock signal terminal coupled to the output sub-circuit to the output signal terminal coupled to (Continued)

the output sub-circuit under control of a voltage signal at the pull-up node, where n is an integer greater than 1.

5 Claims, 9 Drawing Sheets

(56) References Cited

U.S. PATENT DOCUMENTS

| | | |
|---|---|---|
| 2005/0285840 A1 | 12/2005 | Jang et al. |
| 2015/0077319 A1* | 3/2015 | Yao .................... G09G 3/20 345/100 |
| 2015/0170592 A1* | 6/2015 | Bai .................... G11C 19/28 345/100 |
| 2017/0018245 A1 | 1/2017 | Park et al. |
| 2017/0193957 A1 | 7/2017 | Liu et al. |
| 2017/0330526 A1 | 11/2017 | Fan et al. |
| 2018/0190180 A1* | 7/2018 | Shang .................... G09G 3/3677 |

FOREIGN PATENT DOCUMENTS

| | | |
|---|---|---|
| CN | 204102544 U | 1/2015 |
| CN | 105096865 A | 11/2015 |
| CN | 105869566 A | 8/2016 |
| CN | 106023943 A | 10/2016 |
| CN | 106531053 A | 3/2017 |
| CN | 106683634 A | 5/2017 |
| KR | 20060015812 A | 2/2006 |
| KR | 20170010283 A | 1/2017 |

OTHER PUBLICATIONS

International Search Report and English Translation of Box V of the Written Opinion dated Dec. 28, 2018, received for corresponding PCT Application No. PCT/CN2018/108723.

First Chinese Office Action dated Apr. 29, 2020, received for corresponding Chinese Application No. 201810001751.3, 26 pages.

* cited by examiner

SHIFT REGISTER UNIT, GATE DRIVING CIRCUIT AND METHOD FOR DRIVING THE SAME, AND DISPLAY APPARATUS

CROSS-REFERENCE TO RELATED APPLICATION(S)

This application claims priority to Chinese Patent Application No. CN201810001751.3, filed on Jan. 2, 2018, which is incorporated herein by reference in its entirety.

TECHNICAL FIELD

The present disclosure relates to the field of displays, and more particularly, to a shift register unit, a gate driving circuit, a method for driving the same, and a display apparatus.

BACKGROUND

A conventional gate driving circuit comprises multiple stages of cascaded shift register units, wherein each stage of shift register unit controls a row of gate lines. However, such a gate driving circuit has a relatively large footprint, which is disadvantageous for realizing a display panel having a narrower bezel.

SUMMARY

The present disclosure proposes a shift register unit, a gate driving circuit and a method for driving the same, and a display apparatus.

According to an aspect of the present disclosure, there is proposed a shift register unit. The shift register unit comprises: an input sub-circuit coupled to an input signal terminal and a pull-up node and configured to transmit an input signal from the input signal terminal to the pull-up node under control of the input signal; and n output sub-circuits, wherein each of the n output sub-circuits is coupled to the pull-up node, one of n clock signal terminals, a first level signal terminal, and one of n output signal terminals, and is configured to transmit a clock signal from the clock signal terminal coupled to the output sub-circuit to the output signal terminal coupled to the output sub-circuit under control of a voltage signal at the pull-up node, where n is an integer greater than 1.

In an embodiment, the shift register unit further comprises: a reset sub-circuit coupled to a reset signal terminal, the pull-up node, and the first level signal terminal, and configured to transmit a first level signal from the first level signal terminal to the pull-up node under control of a reset signal from the reset signal terminal; and a control sub-circuit coupled to a second level signal terminal, the pull-up node, the first level signal terminal, and a pull-down node, and configured to transmit a second level signal from the second level signal terminal or the first level signal from the first level signal terminal to the pull-down node under control of the voltage signal at the pull-up node.

In an embodiment, each of the n output sub-circuits is further coupled to the pull-down node and is configured to transmit the first level signal from the first level signal terminal to the output signal terminal coupled to the output sub-circuit under control of a voltage signal at the pull-down node.

In an embodiment, the input sub-circuit comprises a first transistor having a first electrode and a gate coupled to the input signal terminal, and a second electrode coupled to the pull-up node.

In an embodiment, each of the n output sub-circuits comprises a second transistor and a third transistor, wherein a gate of the second transistor is coupled to the pull-up node, and a first electrode of the second transistor is coupled to one of the n clock signal terminals, and a gate of the third transistor is coupled to the pull-down node, a first electrode of the third transistor is coupled to the first level signal terminal, and a second electrode of the second transistor and a second electrode of the third transistor are coupled to the output signal terminal of the output sub-circuit.

In an embodiment, each of at least one of the n output sub-circuits further comprises a capacitor coupled between the pull-up node and an output signal terminal coupled to the output sub-circuit.

In an embodiment, the reset sub-circuit comprises a fourth transistor having a first electrode coupled to the pull-up node, a second electrode coupled to the first level signal terminal, and a gate coupled to the reset signal terminal.

In an embodiment, the control sub-circuit comprises a fifth transistor, a sixth transistor, a seventh transistor, an eighth transistor, and a ninth transistor, wherein a first electrode and a gate of the sixth transistor and a first electrode of the eighth transistor are coupled to the second level signal terminal, a first electrode of the fifth transistor, a gate of the seventh transistor, and a gate of the ninth transistor are coupled to the pull-up node, and a second electrode of the fifth transistor, a first electrode of the seventh transistor, and a first electrode of the ninth transistor are coupled to the first level signal terminal, a gate of the fifth transistor, a second electrode of the eighth transistor, and a second electrode of the ninth transistor are coupled to the pull-down node, and a second electrode of the sixth transistor and a gate of the eighth transistor are coupled to a second electrode of the seventh transistor.

According to another aspect of the present disclosure, there is further proposed a gate driving circuit. The gate driving circuit comprises multiple stages of cascaded shift register units according various embodiments described above. the gate driving circuit comprises: 2k clock signal lines, which are sequentially and cyclically coupled to respective clock signal terminals of the multiple stages of shift register units, wherein k is a positive integer, and (k+1)≥n, wherein a reset signal terminal of each stage of shift register unit is coupled to an output signal terminal of one of n output sub-circuits of a next stage of shift register unit.

In an embodiment, a reset signal terminal of each stage of shift register unit is coupled to an output signal terminal of one of next $i^{th}$ to $j^{th}$ stages of shift register units of the stage of shift register unit, where i is equal to ⌈k/n⌉, and j is equal to ⌈(2k+1)/n−1⌉, wherein ⌈ ⌉ is an upper rounding function.

In an embodiment, in a case where n is equal to (k+1), a reset signal terminal of each stage of shift register unit is coupled to an output signal terminal of a $k^{th}$ output sub-circuit in a next stage of shift register unit.

In an embodiment, an input signal terminal of each stage of shift register unit other than a first stage of shift register unit is coupled to an output signal terminal of an $n^{th}$ output sub-circuit of a previous stage of shift register unit.

According to yet another aspect of the present disclosure, there is further proposed a method for driving the gate driving circuit according to various embodiments described above. The method comprises: applying an input signal to a first stage of shift register unit; and sequentially applying 2k clock signals to 2k clock signal lines. A first edge of a first one of the 2k clock signals lags behind a first edge of the input signal by one time period. A first edge of each of the 2k clock signals is ahead of a first edge of a next clock signal by one time period. The time period is (a clock pulse width/2k).

According to a further aspect of the present disclosure, there is further proposed a display apparatus. The display apparatus comprises the gate driving circuit according to various embodiments described above.

BRIEF DESCRIPTION OF THE ACCOMPANYING DRAWINGS

Figure 1:
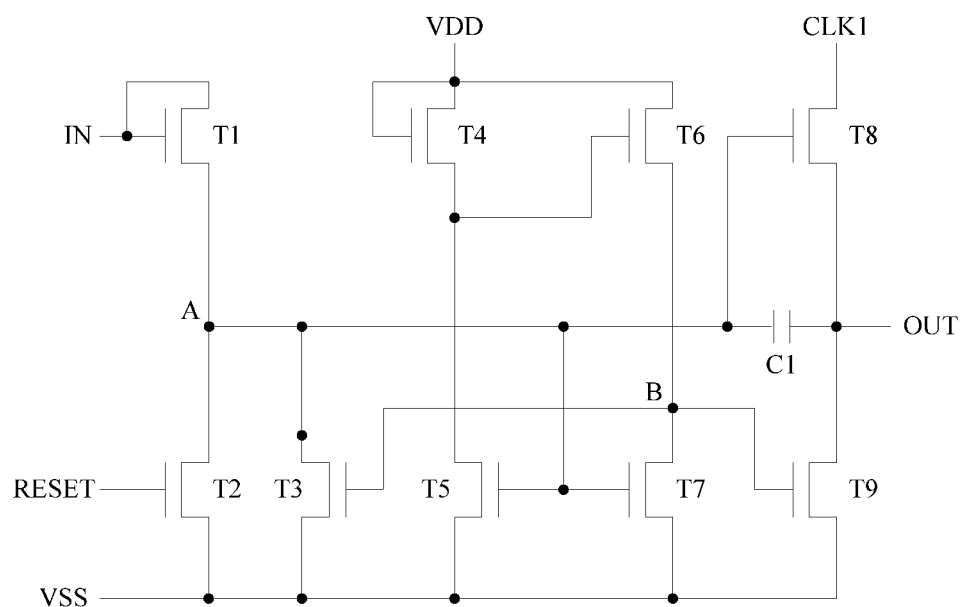
FIG. 1 illustrates a circuit diagram of a shift register unit.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

In order to make the purposes, technical solutions, and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "coupled", "connected", "coupled to" or "connected to" may mean that two components are directly coupled or connected, or that two components are coupled or connected via one or more other components. In addition, the two components can be coupled or connected by wire or wirelessly.

The transistors used in the embodiments of the present disclosure may each be a thin film transistor or a field effect transistor or other devices having the same characteristics. Preferably, the thin film transistor used in the embodiments of the present disclosure may be an oxide semiconductor transistor. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following examples, the description is made by taking an N-type thin film transistor as an example. It can be understood by those skilled in the art that the embodiments of the present disclosure may obviously applied to a case of a P-type thin film transistor.

In an embodiment of the present disclosure, a clock signal is a periodic signal. In one period, the clock signal is divided into successive high level period and low level period by two signal edges (a first edge and a second edge which lags behind the first edge). The term "active operating level" refers to a level at which a controlled transistor may be turned on. When the active operating level is a high level (i.e., the controlled transistor is an N-type transistor), the first edge is a rising edge and the second edge is a falling edge. Conversely, when the active operating level is a low level (i.e., the controlled transistor is a P-type transistor), the first edge is a falling edge and the second edge is a rising edge. Similarly, first edges and second edges of an input signal, an output signal, and a reset signal may also be defined by active operating levels, and details thereof will not be described here again.

In addition, in the description of the present disclosure, the terms "first level signal" and "second level signal" are only used to distinguish magnitudes of the two level signals from each other. For example, the following description is made by taking the "first level signal" being a low level signal, the "second level signal" being a high level signal, the "first level signal terminal" being a low level signal terminal, and the "second level signal terminal" being a high level signal terminal as an example. It can be understood by those skilled in the art that the present disclosure is not limited thereto.

The present disclosure will be described in detail below with reference to the accompanying drawings.

FIG. 1 illustrates a circuit diagram of a shift register unit 100.

As shown in FIG. 1, the shift register unit 100 has a 9T1C (9 transistors and 1 capacitor) structure. The shift register unit 100 receives only one clock signal CLK1 and outputs only one output signal OUT. Therefore, in a gate driving circuit comprising the shift register units 100, one shift register unit needs to be separately provided for each gate line in order to drive the gate line.

Figure 2:
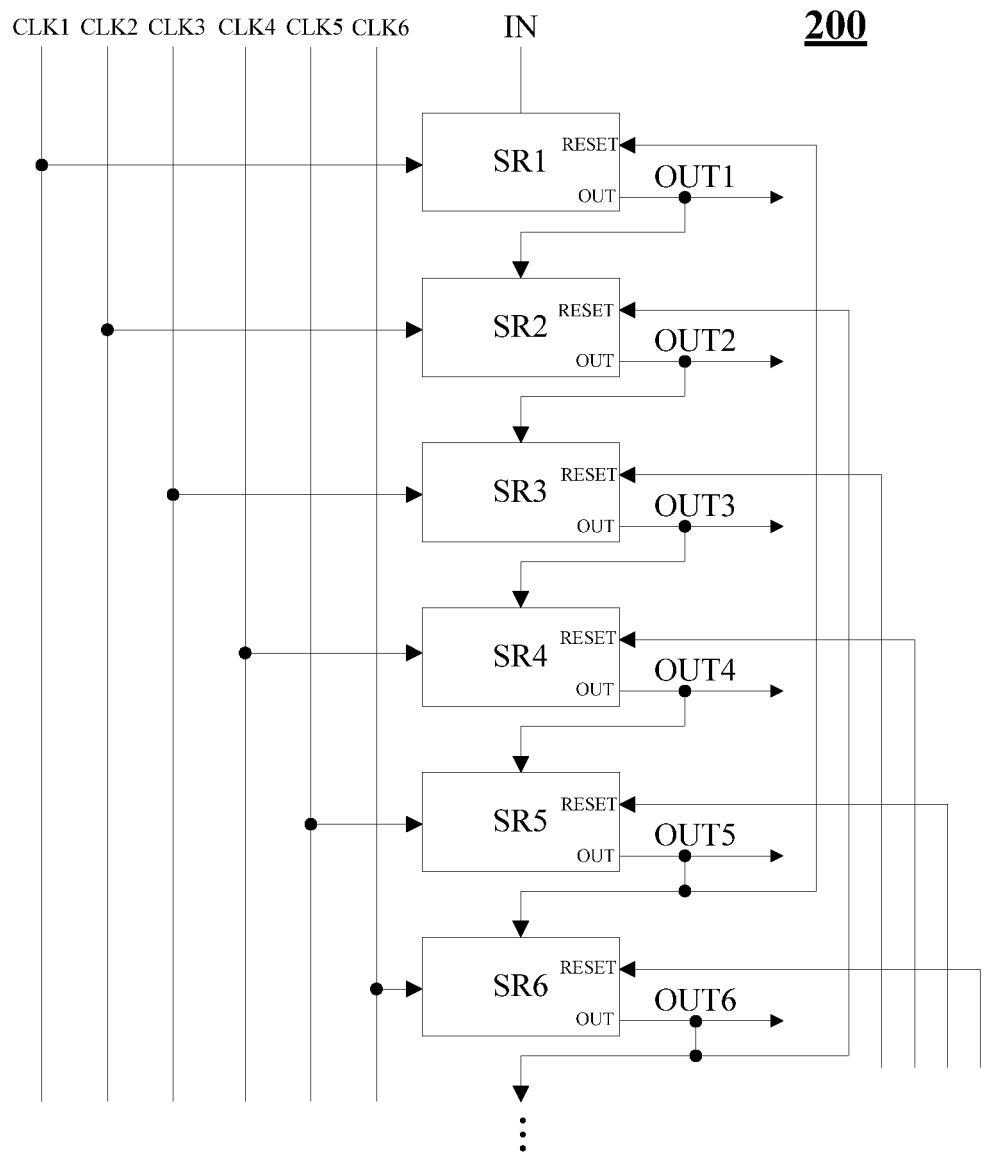
FIG. 2 illustrates a cascade diagram of a gate driving circuit comprising the shift register unit shown in FIG. 1.

FIG. 2 illustrates a gate driving circuit 200 comprising the shift register units 100. As can be seen from FIG. 2, the gate driving circuit 200 receives a total of six clock signals CLK1-CLK6. The six clock signals are sequentially input to successive six stages of shift register units in order, so that each stage of shift register unit generates a separate output (only first six stages of shift register units and their corresponding outputs OUT1-OUT6 are shown in FIG. 2). Here, an output of each stage of shift register unit is not only used to control a separate gate line, but also is used as an input to a next stage of shift register unit. In addition, as shown in FIG. 2, starting from a fifth stage of shift register unit, an output of each stage of shift register unit is also used to reset a previous fourth stage of shift register unit.

Figure 3:
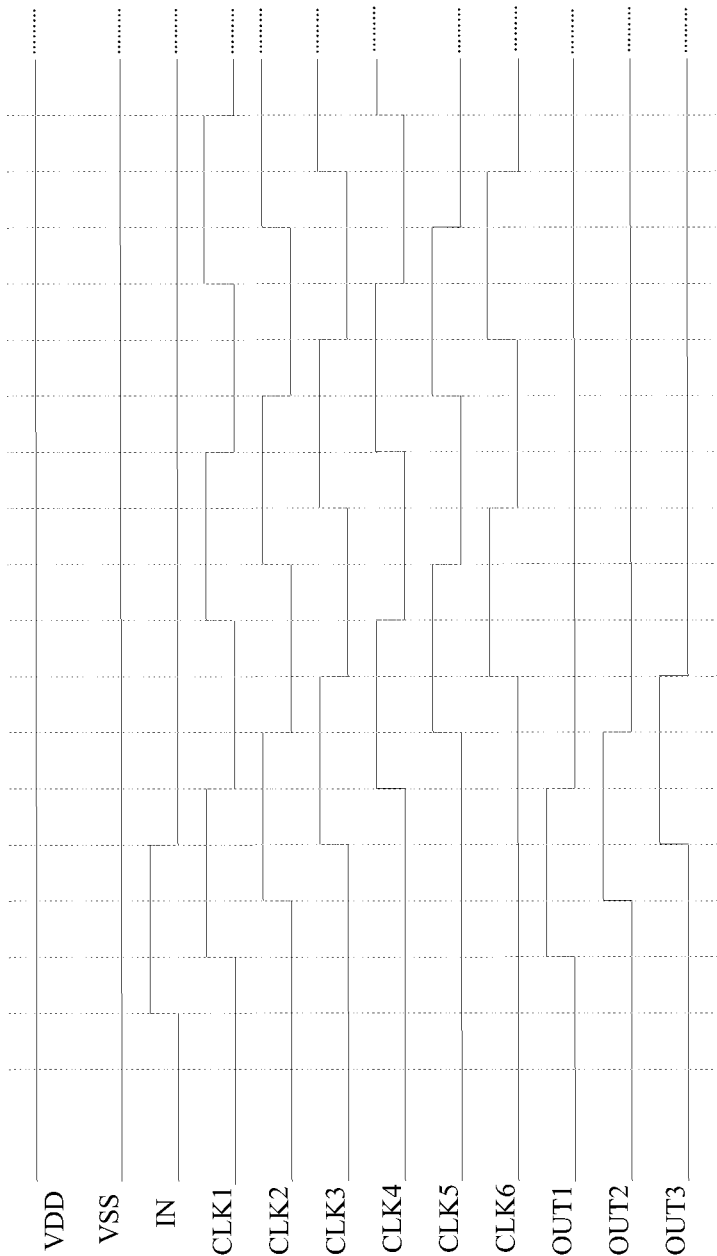
FIG. 3 illustrates a signal timing diagram of the gate driving circuit shown in FIG. 2.

FIG. 3 illustrates a timing diagram of the gate driving circuit 200. As can be seen from FIG. 3, for the gate driving circuit 200 shown in FIG. 2, specific outputs (only OUT1-OUT3 are shown in the figure) are realized by applying the clock signals CLK1-CLK6 as shown in FIG. 3.

However, the gate driving circuit 200 has a relatively large footprint, and if a display panel having a narrower bezel is desired, its circuit configuration needs to be changed.

Figure 4:
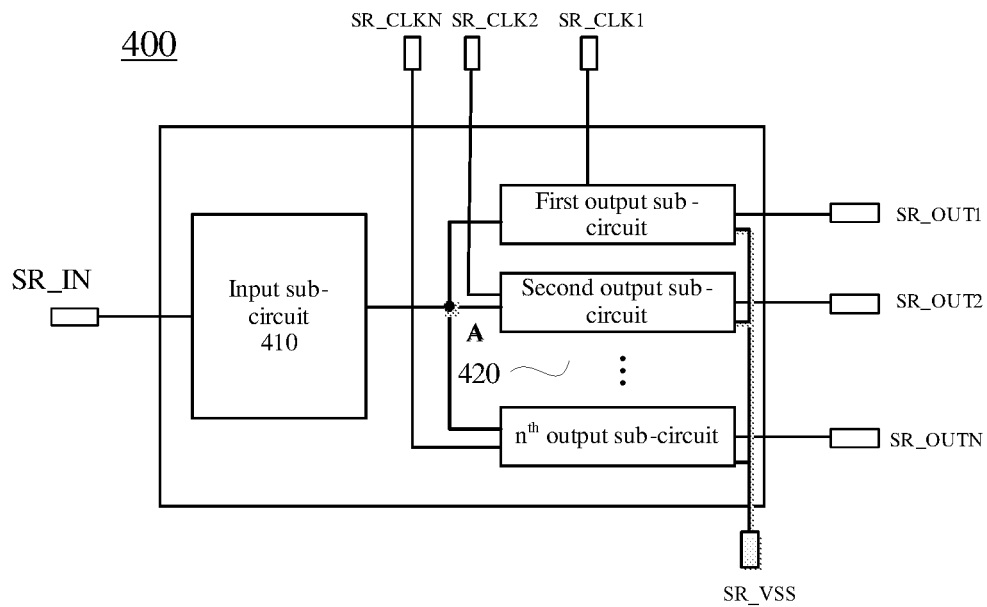
FIG. 4 illustrates a circuit diagram of a shift register unit according to an embodiment of the present disclosure.

FIG. 4 illustrates a block diagram of a shift register unit 400 according to an embodiment of the present disclosure.

As can be seen from FIG. 4, the shift register unit 400 comprises an input sub-circuit 410 and n output sub-circuits 420 (comprising a first output sub-circuit, a second output sub-circuit, . . . , an $n^{th}$ output sub-circuit), where n is an integer greater than 1.

The input sub-circuit 410 is coupled to an input signal terminal SR_IN and a pull-up node A respectively, and is configured to transmit an input signal from the input signal terminal SR_IN to the pull-up node A under control of the input signal.

Each of the n output sub-circuits 420 is coupled to the pull-up node A, one of clock signal terminals SR_CLK1-SR_CLKN, a low level signal terminal SR_VSS, and one of the output signal terminals SR_OUT1-SR_OUTN, and is configured to transmit a clock signal at the clock signal terminal coupled to the output sub-circuit to the output signal terminal coupled to the output sub-circuit under control of a voltage signal at the pull-up node A.

In one embodiment, the shift register unit 400 further comprises a reset sub-circuit and a control sub-circuit. The reset sub-circuit is configured to receive a reset signal. The control sub-circuit is configured to receive a high level signal and a low level signal, and control outputs of the n output sub-circuits 420.

Figure 5:
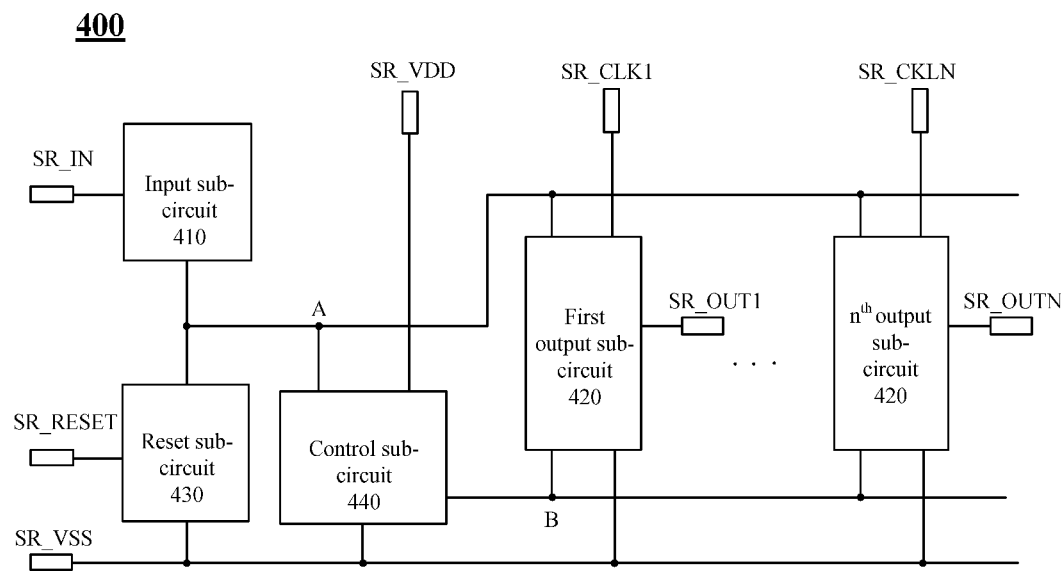
FIG. 5 illustrates a more detailed circuit diagram of the shift register unit shown in FIG. 4.

Specifically, FIG. 5 illustrates a more detailed circuit diagram of the shift register unit 400 shown in FIG. 4. Here, the reset sub-circuit and the control sub-circuit are labeled as 430 and 440 respectively.

The reset sub-circuit 430 is coupled to a reset signal terminal SR_RESET, the pull-up node A, and the low level signal terminal SR_VSS, and is configured to transmit a low level signal from the low level signal terminal SR_VSS to the pull-up node A under control of the reset signal from the reset signal terminal SR_RESET.

The control sub-circuit 440 is coupled to a high level terminal SR_VDD, the pull-up node A, the low level signal terminal SR_VSS, and a pull-down node B, and is configured to transmit a high level signal from the high level signal terminal SR_VDD or the low level signal from the low level signal terminal SR_VSS to the pull-down node B under control of the voltage signal at the pull-up node A.

The reset sub-circuit 430 controls each of the n output sub-circuits 420. Each of the n output sub-circuits 420 is configured to transmit a clock signal (clki, i=1, 2, . . . , n) at a clock signal terminal coupled to the output sub-circuit to an output signal terminal coupled to the output sub-circuit under control of the voltage signal at the pull-up node A, so that an output signal (outi, i=1, 2, . . . , n) is transmitted at the output signal terminal.

It should be understood that an index i of the clock signal clk and the output signal out is indexed from the perspective of a current shift register, rather than the perspective of a gate driving circuit in which the current shift register is located. Hereinafter, when the gate driving circuit is described, the clock signal and the output signal will further be indexed from the perspective of the gate driving circuit. In order to avoid confusion, the clock signal and the output signal are identified by lowercase letters when the clock signal and the output signal are indexed from the perspective of the current shift register, for example, clk1 and out1 represent a first clock signal and a first output signal for the current shift register respectively. When the clock signal and the output signal are indexed from the perspective of the gate driving circuit, uppercase letters are used for indexing, for example, CLK1 and OUT1 represent a first clock signal received by the gate driving circuit and a first output signal output by the gate driving circuit respectively.

Figure 6:
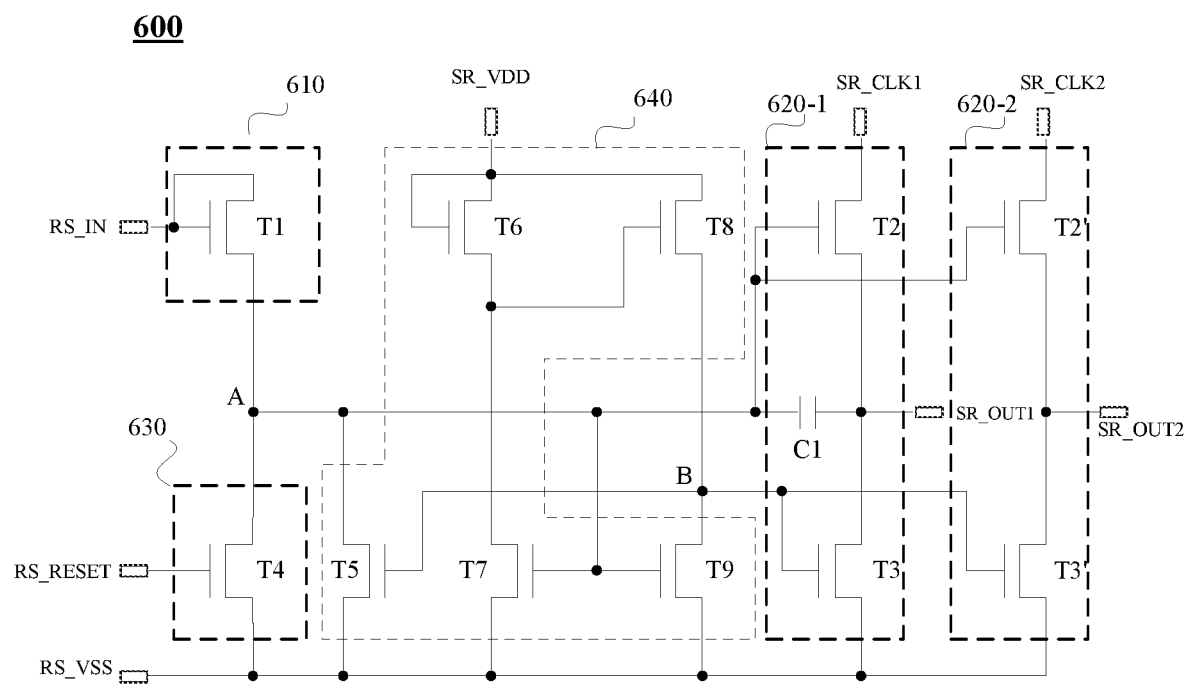
FIG. 6 illustrates a specific exemplary circuit diagram of the shift register unit shown in FIG. 5.

Further, FIG. 6 illustrates a circuit diagram of a shift register unit 600 for one case of the shift register unit shown in FIG. 5. Specifically, in the shift register unit 600, n=2. That is, the shift register unit 600 comprises two output sub-circuits 620, which are a first output sub-circuit 620-1 and a second output sub-circuit 620-2 respectively.

As shown in FIG. 6, in the shift register unit 600, an input sub-circuit 610 comprises a first transistor T1. A first electrode of T1 is coupled in parallel with a gate of T1, and is coupled to an input signal terminal SR_IN to receive an input signal IN from the input signal terminal SR_IN. A second electrode of T1 is coupled to a pull-up node A.

Each of the first output sub-circuit 620-1 and the second output sub-circuit 620-2 comprises a second transistor (T2, T2') and a third transistor (T3, T3'). In the first output sub-circuit 620-1, a first electrode of T2 is coupled to a first clock signal terminal SR_CLK1 to receive a clock signal clk1 from the first clock signal terminal SR_CLK1. A gate of T2 is coupled to the pull-up node A. A gate of T3 is coupled to a pull-down node B. A first electrode of T3 is coupled to a low level signal terminal SR_VSS to receive a low level signal VSS. A second electrode of T2 and a second electrode of T3 are coupled to a first output signal terminal SR_OUT1 to transmit an output signal out1 to the first output signal terminal SR_OUT1.

Similarly, in the second output sub-circuit 620-2, a first electrode of T2' is coupled to a second clock signal terminal SR_CLK2 to receive a clock signal clk2 from the second clock signal terminal SR_CLK2. A gate of T2' is coupled to the pull-up node A. A gate of T3' is coupled to the pull-down node B. A first electrode of T3' is coupled to the low level signal terminal SR_VSS to receive the low level signal VSS. A second electrode of T2' and a second electrode of T3' are coupled to a second output signal terminal SR_OUT2 to transmit an output signal out2 to the second output signal terminal SR_OUT2.

The reset sub-circuit 630 comprises a fourth transistor T4. A first electrode of T4 is coupled to the pull-up node A, and a second electrode of T4 is coupled to the low level signal terminal SR_VSS. In one embodiment, the first electrode of T4 is coupled to the pull-up node A and the second electrode of T4 is configured to receive the low level signal VSS. In another embodiment, the first electrode of T4 is coupled to the low level signal terminal SR_VSS, and the second electrode of T4 is coupled to the pull-up node A. In addition, a gate of T4 is coupled to a reset signal terminal SR_RESET to receive a reset signal.

The control sub-circuit 640 comprises a fifth transistor T5, a sixth transistor T6, a seventh transistor T7, an eighth transistor T8, and a ninth transistor T9.

A first electrode of T6, a gate of T6 and a first electrode of T8 are coupled to a high level signal terminal SR_VDD to receive a high level signal VDD. A first electrode of T5, a gate of T7, and a gate of T9 are coupled to the pull-up node A. A second electrode of T5, a first electrode of T7 and a first electrode of T9 are coupled to the low level signal terminal SR_VSS to receive the low level signal VSS. A gate of T5, a second electrode of T8, and a second electrode of T9 are coupled to the pull-down node B. In addition, a second electrode of T6 and a gate of T8 are coupled to a second electrode of T7.

The first output sub-circuit 620-1 further comprises a capacitor C1. The capacitor C1 is coupled between the pull-up node A and the first output signal terminal SR_OUT1. The second output sub-circuit 620-2 is shown as not comprising any capacitor. It should be understood that the structure shown in shift register unit 600 is merely an example, and in other embodiments, the capacitor C1 may not be disposed in the first output sub-circuit 620-1, and/or in the second output sub-circuit 620, a capacitor is correspondingly disposed between the pull-up node A and the second output signal terminal SR_OUT2.

Figure 7:
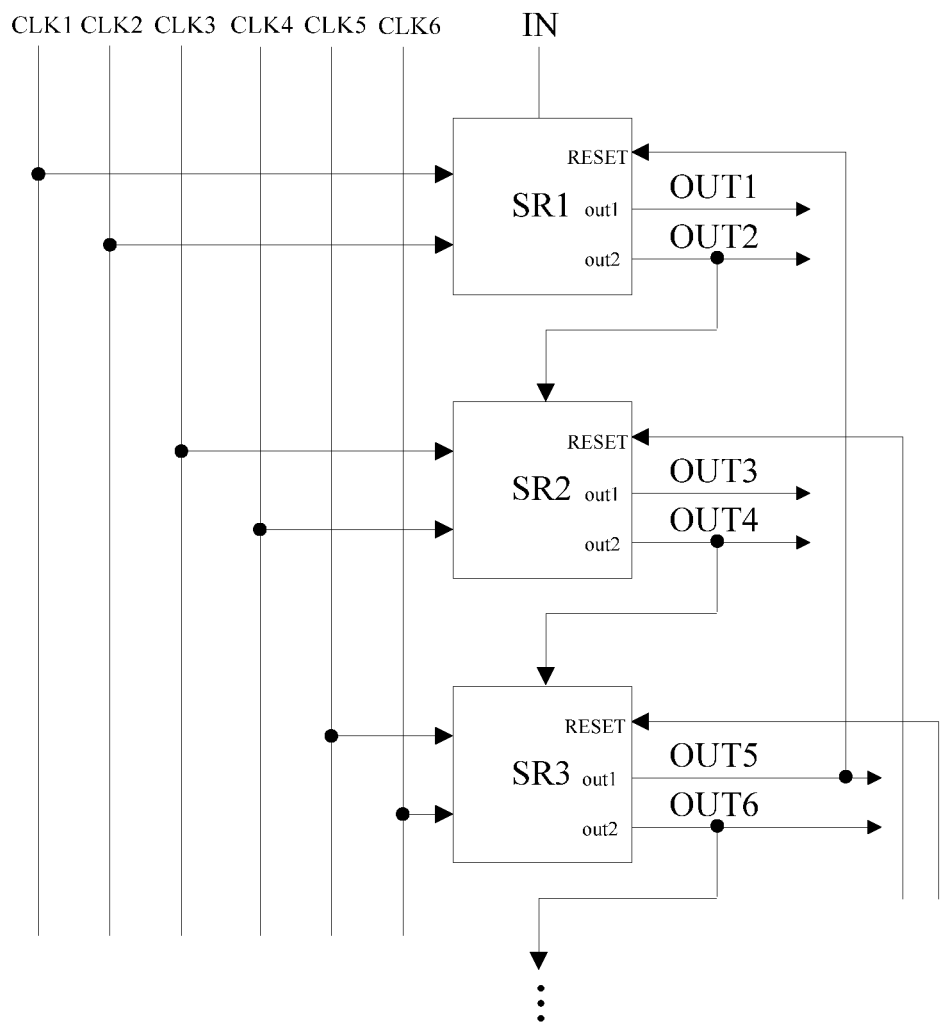
FIG. 7 illustrates a cascade diagram of a gate driving circuit comprising the exemplary shift register unit shown in FIG. 6.
Figure 8:
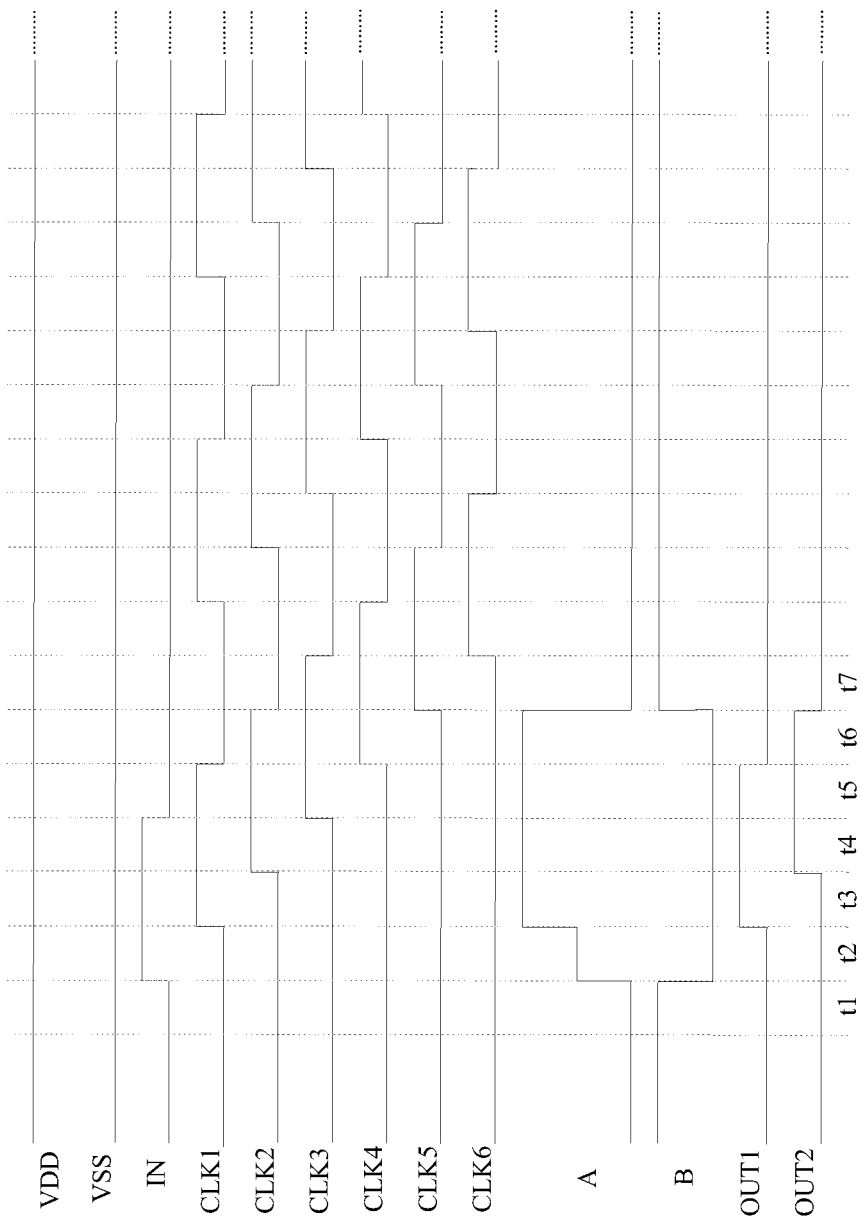
FIG. 8 illustrates a signal timing diagram of the gate driving circuit shown in FIG. 7.

Further, FIG. 7 illustrates a cascade diagram of the gate driving circuit 700 comprising the shift register units shown in FIG. 6. FIG. 8 illustrates a signal timing diagram of the gate driving circuit 700 shown in FIG. 7.

Firstly, as can be seen from FIG. 7, the gate driving circuit 700 uses a six-clock configuration to receive a total of six clock signals CLK1-CLK6. As shown in FIG. 8, phases of adjacent ones of the clock signals are different by 1/6 cycles. Generally, a total of 2k clock signal lines are arranged in the gate driving circuit to apply 2k clock signals, and phases of adjacent ones of the clock signals are different by 1/2 k cycles, where k is a positive integer. In the embodiment shown in FIG. 7, k=3 is taken as an example. It should be understood by those skilled in the art that the technical solutions of the present disclosure are equally applicable to a case where k is another positive integer.

Generally, for a gate driving circuit having 2k clock signal lines, in a case where each shift register unit has n output sub-circuits, there is the following constraint:

$$k+1 \geq n.$$

This is because that a first edge of a clock signal, which is firstly received in each shift register unit, in a next period should lag behind or be synchronized to a second edge of a clock signal, which is lastly received in the shift register unit, in a current period; otherwise, resetting cannot be appropriately realized in the shift register unit. Thus, $1+2k \geq n+k$ is required, that is, $k+1 \geq n$.

The six clock signals CLK1-CLK6 are sequentially and cyclically provided to respective clock signal terminals of various stages of shift register units in the gate driving circuit 700 in turn. As an example, only first three stages of shift register units SR1, SR2, and SR3 of the gate driving circuit 700 are shown in FIG. 7. Since the gate driving circuit 700 uses the shift register unit 600 shown in FIG. 6 as the shift register units therein, each stage of shift register unit has two output sub-circuits, that is, each stage of shift register unit receives two clock signals and outputs two output signals. Specifically, a first stage of shift register unit SR1 receives clock signals CLK1 and CLK2, and transmits output signals OUT1 and OUT2; a second stage of shift register unit SR2 receives clock signals CLK3 and CLK4, and transmits output signals OUT3 and OUT4; a third stage of shift register unit SR3 receives clock signals CLK5 and CLK6, and transmits output signals OUT5 and OUT6; and so on.

As shown in FIG. 7, the first stage of shift register unit SR1 receives an input signal IN from the outside. Starting from the second stage of shift register unit SR2, each stage of shift register unit (SR2, SR3 . . . ) receives an output signal from a last output sub-circuit of a previous stage of shift register unit (SR1, SR2, . . . ) as an input signal IN. Each stage of shift register unit receives an output signal from one of output sub-circuits in a next stage of shift register unit as a reset signal RESET. Specifically, in the gate driving circuit 700 shown in FIG. 7, for a current stage of shift register unit (for example, SR1), a first output signal (for example, OUT5 output from SR3) of a next second stage of shift register unit (for example, SR3) is used to reset the current stage of shift register unit.

It should be understood that in other embodiments, an output signal different from OUT5 may be selected to reset SR1, which will be analyzed below.

In general, since in each shift register unit, a first edge of a reset signal RESET lags behind or is synchronized to a second edge of one of clock signals which is lastly received in a current period, and is ahead of or is synchronized to a first edge of one of the clock signals, which is firstly received in the current period, in a next period, it may be determined that the reset signal RESET received by each stage of shift register unit is an output signal from one of next $i^{th}$ to $j^{th}$ stages of shift register units, where i is equal to $\lceil k/n \rceil$, and j is equal to $\lceil (2k+1)/n-1 \rceil$, wherein $\lceil \ \rceil$ is an upper rounding function.

Specifically, for a case where n is equal to k+1, i=1, and j=1, that is, each stage of shift register unit will receive an output signal from a next stage of shift register unit as a reset signal. Further, since a first edge of a reset signal RESET lags behind a second edge of a clock signal which is lastly received in a current shift register unit, it may be determined that an output signal for resetting the shift register unit may only be a last output signal of a next stage of shift register unit.

For a case where n is less than k+1 (i.e., n is less than or equal to k), when n=k, i and j has the smallest difference. At this time, i=1, and j=2, that is, in a case where n is less than k+1, i is, for example, less than j. This illustrates that even if a number of output sub-circuits in the shift register unit and a number of clock signals belonging to the gate driving circuit are fixed, when n is less than k+1, each stage of shift register unit may receive reset signals from different shift register units in different gate driving circuit configurations.

Returning back to FIG. 7, in the gate driving circuit 700 shown in FIG. 7, n is equal to 2, and k is equal to 3, which satisfy the case where n is less than k+1. It may be calculated that i=2, and j=3, that is, each stage of shift register unit in FIG. 7 may receive a reset signal from a next second or third stage of shift register. Specifically, by taking the shift register SR1 as an example, in addition to the case shown in FIG. 7 where the output signal OUT5 is received by the shift register SR1 from the next second stage of shift register SR3 as a reset signal RESET, it may be determined that the shift register SR1 may also receive the output signal OUT6 from the shift register SR3 as a reset signal, or receive an output signal OUT7 from a shift register SR4 as a reset signal.

An operation of the shift register SR1 having the structure of the shift register 600 shown in FIG. 6 will be described below with reference to the case shown in FIG. 7 (that is, the output signal OUT5 of the shift register SR3 is used as the reset signal RESET of the shift register SR1) in conjunction with a timing diagram in FIG. 8.

According to the timing diagram in FIG. 8, one clock period is equally divided into six time periods, and a first edge of each of the six clock signals CLK1-CLKn is ahead of a first edge of a next clock signal by one time period, that is, phases of adjacent ones of the clock signals are different by ⅙ clock periods. Further, a first edge of the first clock signal CLK1 in a first period lags behind a first edge of an input signal IN by one time period.

Since clk1 and clk2 are equivalent to CLK1 and CLK2 and out1 and out2 are equivalent to OUT1 and OUT2 for the shift register unit SR1, the operation will be described below by uniformly using CLK1, CLK2, OUT1, and OUT2 without distinguishing them from each other.

The operation of the shift register SR1 starts at a time period t1. In the time period t1, the input signal IN is at a low level, the first clock signal CLK1 is at a low level, the second clock signal CLK2 is at a low level, and the reset signal RESET is at a low level (see CLK5 for a potential of RESET). VDD is at a high level, which causes the sixth transistor T6 and the eighth transistor T8 to be turned on, so that the pull-down node B is at a high level. Thereby, the pull-down node B is at a high level, which causes the fifth transistor T5 and the third transistors T3 and T3' to be turned on, so that the pull-up node A is at a low level. The pull-up node A is at a low level, which causes the second transistors T2 and T2' to be turned off. At this time, the first output signal OUT1 and the second output signal OUT2 are both at a low level.

Next, in a time period t2, the input signal IN is at a high level, the first clock signal CLK1 is at a low level, the second clock signal CLK2 is at a low level, and the reset signal RESET is at a low level. The input signal IN is at a high level, which causes the first transistor T1 to be turned on, so that the pull-up node A is raised to a high level. This in turn causes the ninth transistor T9 and the second transistors T2 and T2' to be turned on. By setting channel width to length ratios of the related transistors, the pull-down node B may become a low level. This causes the fifth transistor T5 and the third transistors T3 and T3' to be turned off. At this time, since CLK1 and CLK2 are still at a low level, the first output signal OUT1 and the second output signal OUT2 are still at a low level.

Then, in a time period t3, the input signal IN is at a high level, the first clock signal CLK1 is at a high level, the second clock signal CLK2 is at a low level, and the reset signal RESET is at a low level. The first transistor T1 is initially turned on, the pull-up node A is maintained at a high level in the time period t2, and the second transistor T2 is turned on. Since the first clock signal CLK1 changes from a low level to a high level, the first output signal OUT1 changes from a low level to a high level at this time. The potential at the pull-up node A is further raised under action of the first capacitor C1. At this time, since the potential at the pull-up node A is higher than the high level at IN, the first transistor T1 starts to change from a turn-on state to a turn-off state. The second transistor T2 is still turned on, and the first output signal OUT1 is still at a high level. Thus, the positive feedback continues, and finally the pull-up node A is maintained at a high level higher than the high level of CLK1. Further, the second transistor T2' is also turned on, and since the second clock signal CLK is still at a low level, the second output signal OUT2 is also maintained at a low level.

In a time period t4, the input signal IN is at a high level, the first clock signal CLK1 is at a high level, the second clock signal CLK2 is at a high level, and the reset signal RESET is at a low level. The first transistor T1 is turned off, and the pull-up node A is at a high level. Similarly to the case in the time period t3, since CLK2 also changes from a low level to a high level, OUT2 changes from a low level to a high level. At this time, the first output signal OUT1 and the second output signal OUT2 are both at a high level.

In a time period t5, the input signal IN is at a low level, the first clock signal CLK1 is at a high level, the second clock signal CLK2 is at a high level, and the reset signal RESET is at a low level. Since a voltage across the first capacitor C1 cannot be abruptly changed, similarly to the case in the time period t4, the pull-up node A is still maintained at a high level higher than the high level of the CLK2, and at this time, the first output signal OUT1 and the second output signal OUT2 are still at a high level.

In a time period t6, the input signal IN is at a low level, the first clock signal CLK1 is at a low level, the second clock signal CLK2 is at a high level, and the reset signal RESET is at a low level. Since the voltage across the first capacitor C1 cannot be abruptly changed, similarly to the case in the time period t5, the pull-up node A is still maintained at a high level higher than the high level of the CLK2, and the pull-down node B is at a low level. At this time, since the first clock signal CLK1 becomes a low level, the first output signal OUT1 also becomes a low level accordingly. However, the second output signal OUT2 is maintained at a high level.

In a time period t7, the input signal IN is at a low level, the first clock signal CLK1 is at a low level, the second clock signal CLK2 is at a low level, and the reset signal RESET is at a high level. Since the reset signal RESET becomes a high level, the fourth transistor T4 is turned on, to pull the pull-up node A to a low level. Thereby, the ninth transistor T9 is turned off, and thereby the pull-down node B becomes a high level under action of VDD. This causes the third transistors T3 and T3' to be turned on. Thereby, the first output signal OUT1 and the second output signal OUT2 are both pulled to a low level by VSS.

Thus, it can be known by comparing OUT1 and OUT2 in FIGS. 8 and 3 that the same output as that of the conventional gate driving circuit 200 is realized by the shift register unit 600 shown in FIG. 6 and the gate driving circuit 700 shown in FIG. 7. However, a number of transistors used by the gate driving circuit 700 is greatly reduced as compared with the conventional gate driving circuit, thereby saving a footprint of the gate driving circuit, and realizing a display panel having a narrower bezel.

The above description has been made by taking a case where the first stage of shift register unit SR1 receives the output signal OUT5 as the reset signal RESET as an example. It should be understood by those skilled in the art that the same effect may be achieved in cases where OUT6 and OUT7 are used as reset signals of SR1, i.e., achieving the same output as that of the conventional gate driving circuit 200. This is because that although the use of OUT6 or OUT7 as a reset signal may delay the resetting by one or two time periods, in these two time periods, CLK1 and CLK2 are at a low level, and thereby output results of OUT1 and OUT2 are not affected.

FIGS. 6-7 illustrate a case where two output sub-circuits are included in each shift register unit (i.e., n=2). It can be seen from the above analysis that when k is equal to 3, n may also have a value of 3 or 4 under a constraint of n≤k+1.

It should be understood by those skilled in the art that for a case where n=3 or n=4, as in the case where n=2, the same output as that of the conventional gate driving circuit 200 may be achieved. In the case where n=3 or 4, the structure of the gate driving circuit is further simplified, thereby further saving a footprint of the gate driving circuit, and realizing a display panel having a narrower bezel.

Figure 9:
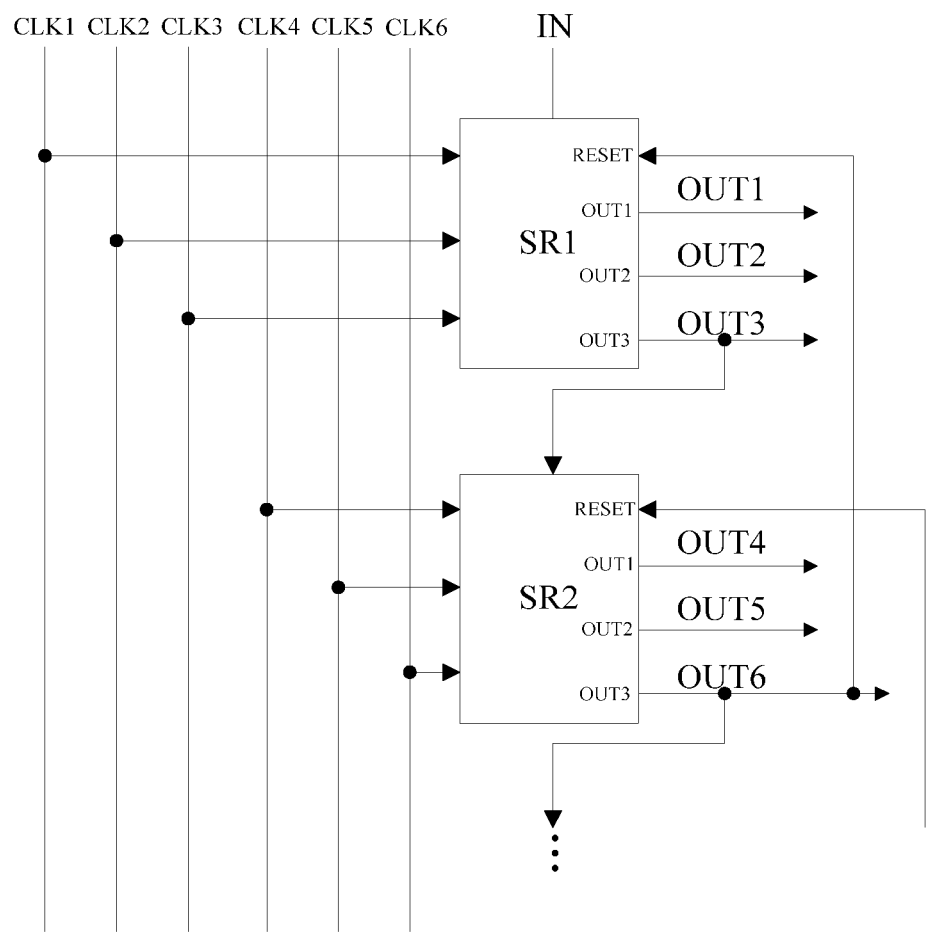
FIG. 9 illustrates a cascade diagram of a gate driving circuit comprising another exemplary shift register unit.

FIG. 9 illustrates a cascade diagram of a gate driving circuit corresponding to the case where n=3. According to the above description, when n=3, i=⌈k/n−1⌉=1, and j=⌈(2k+1)/n−1⌉=2, that is, the reset signal may come from a next stage of shift register unit or a next second stage of shift register unit of a current stage of shift register unit. At this time, output signals which may be used to reset the shift register SR1 in FIG. 9 comprise OUT6 (corresponding to FIG. 9) and OUT7.

Figure 10:
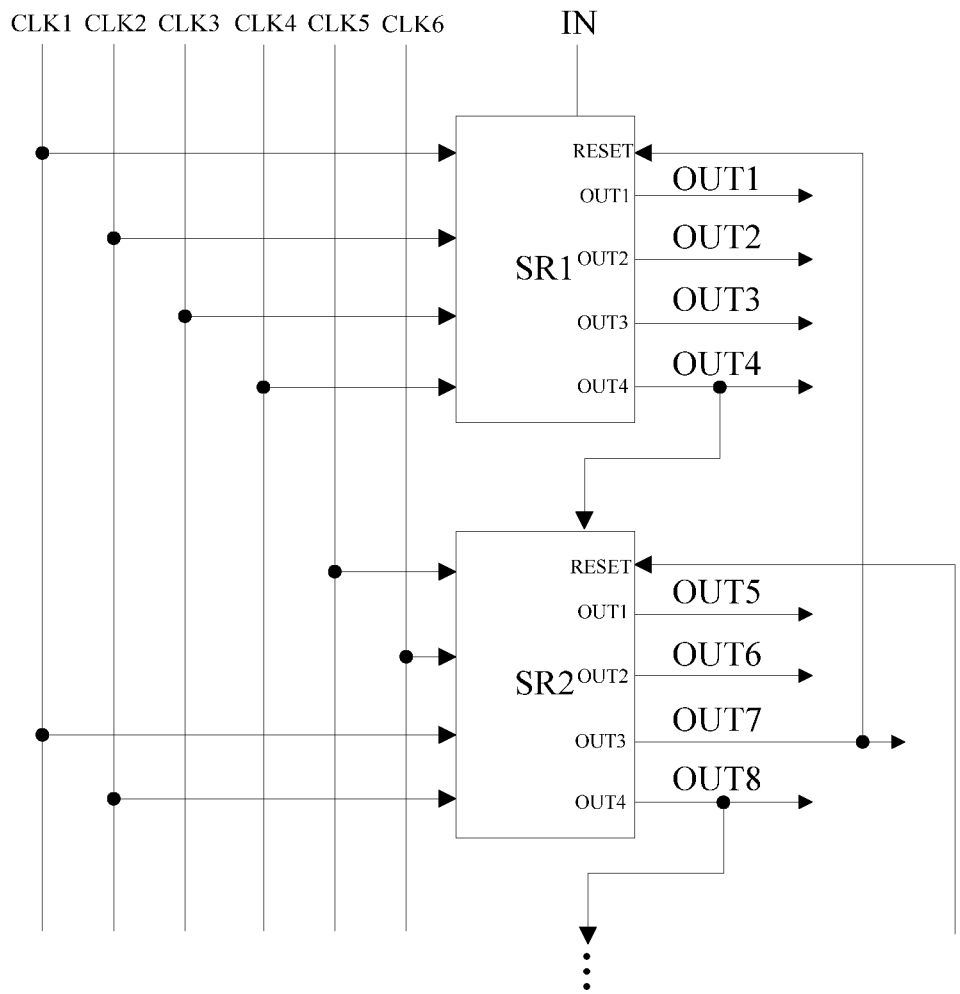
FIG. 10 illustrates a cascade diagram of a gate driving circuit comprising yet another exemplary shift register unit.

FIG. 10 illustrates a cascade diagram of the gate driving circuit corresponding to the case where n=4. According to the above description, when n=4, i=⌈k/n−1⌉=1, and j=⌈(2k+1)/n−1⌉=1, that is, the reset signal may only come from a next stage of shift register unit of a current stage of shift register unit. At this time, an output signal which may be used to reset the shift register SR1 in FIG. 10 is OUT7 (FIG. 10).

Figure 11:
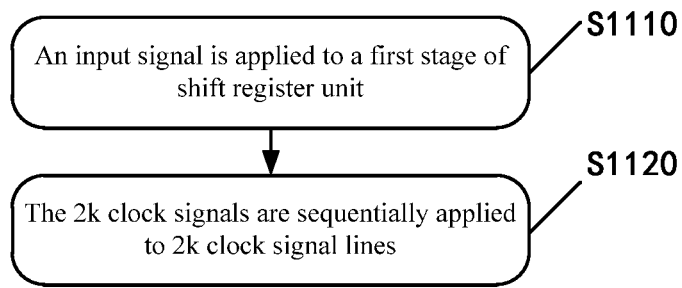
FIG. 11 illustrates a flowchart of a method for driving a gate driving circuit according to an embodiment of the present disclosure.

FIG. 11 illustrates a flowchart of a method 1100 for driving a gate driving circuit according to an embodiment of the present disclosure. As described above, the gate driving circuit according to the present disclosure generally comprises multiple stages of cascaded shift register units and has 2k clock signal lines. Here, each of the shift register units has n output sub-circuits.

The method 1100 starts at step S1110, in which an input signal is applied to a first stage of shift register unit of the gate driving circuit. Then, in step S1120, the above 2k clock signals are sequentially applied to 2k clock signal lines.

A first edge of a first one of the 2k clock signals in a first period lags behind a first edge of the input signal by one time period, and a first edge of each of the 2k clock signals is ahead of a first edge of a next clock signal by one time period. In an example, this time period is equal to a clock pulse width/n.

Further, the embodiments of the present disclosure further provide a display apparatus comprising the gate driving circuit according to various embodiments described above. Specifically, the display apparatus may be a liquid crystal display apparatus such as a liquid crystal panel, a liquid crystal television, a mobile phone, an electronic reader, a liquid crystal display, etc.

Although the present disclosure has been described with reference to a few exemplary embodiments, it should be understood that the terms used are illustrative and exemplary and not restrictive. Since the present disclosure may be embodied in a variety of forms without departing from the spirit or scope of the present disclosure, it should be understood that the above-described embodiments are not limited to any details described above, but are construed broadly within the spirit and scope defined by the appended claims. Therefore, all changes and modifications which fall within the scope of the claims or the equivalents thereof are intended to be covered by the appended claims.

I claim:

1. A gate driving circuit comprising multiple stages of cascaded shift register units,
wherein the shift register units comprise:
an input sub-circuit coupled to an input signal terminal and a pull-up node and configured to transmit an input signal from the input signal terminal to the pull-up node under control of the input signal, wherein the input sub-circuit comprises a first transistor having a first electrode and a gate coupled to the input signal terminal, and a second electrode coupled to the pull-up node;
a reset sub-circuit coupled to a reset signal terminal, the pull-up node, and a first level signal terminal, and configured to transmit a first level signal from the first level signal terminal to the pull-up node under control of a reset signal from the reset signal terminal, wherein the reset sub-circuit comprises a fourth transistor having a first electrode coupled to the pull-up node, a second electrode coupled to the first level signal terminal, and a gate coupled to the reset signal terminal;
a control sub-circuit coupled to a second level signal terminal, the pull-up node, the first level signal terminal, and a pull-down node, and configured to transmit a second level signal from the second level signal terminal or the first level signal from the first level signal terminal to the pull-down node under control of the voltage signal at the pull-up node, wherein the control sub-circuit comprises a fifth transistor, a sixth transistor, a seventh transistor, an eighth transistor, and a ninth transistor, wherein a first electrode and a gate of the sixth transistor and a first electrode of the eighth transistor are coupled to the second level signal terminal, a first electrode of the fifth transistor, a gate of the seventh transistor, and a gate of the ninth transistor are coupled to the pull-up node, and a second electrode of the fifth transistor, a first electrode of the seventh transistor, and a first electrode of the ninth transistor are coupled to the first level signal terminal, a gate of the fifth transistor, a second electrode of the eighth transistor, and a second electrode of the ninth transistor are coupled to the pull-down node, and a second electrode of the sixth transistor and a gate of the eighth transistor are coupled to a second electrode of the seventh transistor; and
n output sub-circuits, wherein each of the n output sub-circuits is coupled to the pull-up node, one of n clock signal terminals, a first level signal terminal, and one of n output signal terminals, and is configured to transmit a clock signal from the clock signal terminal coupled to the output sub-circuit to the output signal terminal coupled to the output sub-circuit under control of a voltage signal at the pull-up node, where n is an integer greater than 1, each of the n output sub-circuits is further coupled to the pull-down node and is configured to transmit the first level signal from the first level signal terminal to the output signal terminal coupled to the output sub-circuit under control of a voltage signal at the pull-down node, each of the n output sub-circuits comprises a second transistor and a third transistor, wherein a gate of the second transistor is coupled to the pull-up node, and a first electrode of the second transistor is coupled to one of the n clock signal terminals, and a gate of the third transistor is coupled to the pull-down node, a first electrode of the third transistor is coupled to the first level signal terminal, and a second electrode of the second transistor and a second electrode of the third transistor are coupled to the output signal terminal of the output sub-circuit, each of at least one of the n output sub-circuits further comprises a capacitor coupled between the pull-up node and an output signal terminal coupled to the output sub-circuit; and wherein the gate driving circuit comprises:

2k clock signal lines, which are sequentially and cyclically coupled to respective clock signal terminals of the multiple stages of shift register units, wherein k is a positive integer, and $(k+1) \geq n$, wherein a reset signal terminal of each stage of shift register unit is coupled to an output signal terminal of one of n output sub-circuits of a next stage of shift register unit;

wherein a first edge of a first one of 2k clock signals lags behind a first edge of the input signal by one time period, and a first edge of each of the 2k clock signals is ahead of a first edge of a next clock signal by one time period, an active operating period of each of the 2k clock signals comprises k time periods;

wherein the time period is (a clock pulse width/2k); and wherein a reset signal terminal of each stage of shift register unit is coupled to an output signal terminal of one of next $i^{th}$ to $j^{th}$ stages of shift register units of the stage of shift register unit, where i is equal to $\lceil k/n \rceil$, and j is equal to $\lceil (2k+1)/n-1 \rceil$, wherein $\lceil \rceil$ is an upper rounding function, so that an active outputting period of each output signal comprises k time periods.

2. The gate driving circuit according to claim 1, wherein in a case where n is equal to (k+1), a reset signal terminal of each stage of shift register unit is coupled to an output signal terminal of a $k^{th}$ output sub-circuit in a next stage of shift register unit.

3. The gate driving circuit according to claim 1, wherein an input signal terminal of each stage of shift register unit other than a first stage of shift register unit is coupled to an output signal terminal of an $n^{th}$ output sub-circuit of a previous stage of shift register unit.

4. A method for driving the gate driving circuit according to claim 1, comprising:

applying an input signal to a first stage of shift register unit; and sequentially applying the 2k clock signals to the 2k clock signal lines.

5. A display apparatus, comprising the gate driving circuit according to claim 1.

* * * * *